(12) United States Patent
Beckers et al.

(10) Patent No.: US 8,462,314 B2
(45) Date of Patent: Jun. 11, 2013

(54) LITHOGRAPHIC APPARATUS AND DEVICE MANUFACTURING METHOD

(75) Inventors: Marcel Beckers, Eindhoven (NL); Marcus Adrianus Van De Kerkhof, Helmond (NL); Siebe Landheer, Eindhoven (NL); Wouterus Johannes Petrus Maria Maas, Boxtel (NL); Jeroen Peter Johannes Bruijstens, Eindhoven (NL); Ivo Adam Johannes Thomas, Son (NL); Franciscus Johannes Joseph Janssen, Eindhoven (NL); Bartholomeus Mathias Van Oerle, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 569 days.

(21) Appl. No.: 12/222,123

(22) Filed: Aug. 1, 2008

(65) Prior Publication Data
US 2009/0059192 A1    Mar. 5, 2009

Related U.S. Application Data

(60) Provisional application No. 60/935,247, filed on Aug. 2, 2007, provisional application No. 60/996,785, filed on Dec. 5, 2007.

(51) Int. Cl.
*G03B 27/52* (2006.01)
*G03B 27/42* (2006.01)
*G03F 7/20* (2006.01)

(52) U.S. Cl.
CPC ........ *G03F 7/70341* (2013.01); *G03F 7/70958* (2013.01)
USPC ............................................. 355/55; 355/53

(58) Field of Classification Search
USPC .......................................... 355/53, 30, 55, 77
See application file for complete search history.

(56) References Cited

U.S. PATENT DOCUMENTS

| 4,509,852 A | 4/1985 | Tabarelli et al. |
| 7,528,929 B2 | 5/2009 | Streefkerk et al. |

(Continued)

FOREIGN PATENT DOCUMENTS

| CN | 1892433 | 1/2007 |
| EP | 1 420 300 A2 | 5/2004 |

(Continued)

OTHER PUBLICATIONS

Chinese Office Action dated Aug. 4, 2010 in related Chinese patent application No. 200810145180.7.

(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus includes a projection system configured to project a patterned radiation beam onto a target portion of a substrate. The apparatus also includes a barrier member, surrounding a space between the projection system and, in use, the substrate, to define in part with the projection system a reservoir for liquid. A radially outer surface of the barrier member facing a portion of projection system and a radially outer surface of the portion of the projection system facing the barrier member each have a liquidphobic outer surface. The liquidphobic outer surface of the barrier member and/or the liquidphobic outer surface of the portion of the projection system has an inner edge that defines in part the reservoir.

28 Claims, 8 Drawing Sheets

U.S. PATENT DOCUMENTS

| | | |
|---|---|---|
| 2004/0136494 A1 | 7/2004 | Lof et al. |
| 2004/0207824 A1 | 10/2004 | Lof et al. |
| 2006/0038968 A1 | 2/2006 | Kemper et al. |
| 2006/0139593 A1* | 6/2006 | Nagasaka et al. ........... 355/53 |
| 2006/0158627 A1 | 7/2006 | Kemper et al. |
| 2006/0176456 A1 | 8/2006 | Nagasaka |
| 2006/0231206 A1 | 10/2006 | Nagasaka |
| 2006/0250593 A1 | 11/2006 | Nishii |
| 2007/0004182 A1 | 1/2007 | Chang et al. |
| 2007/0081140 A1 | 4/2007 | Beckers et al. |
| 2007/0146663 A1 | 6/2007 | Nagasaka |
| 2007/0188879 A1* | 8/2007 | Ikezawa et al. ........... 359/649 |
| 2007/0195301 A1* | 8/2007 | Nagasaka ........... 355/53 |
| 2007/0201011 A1 | 8/2007 | Kokubun |
| 2007/0216889 A1 | 9/2007 | Nishii |
| 2007/0222958 A1 | 9/2007 | Nishii |
| 2009/0233233 A1* | 9/2009 | Six et al. ........... 430/289.1 |
| 2009/0253083 A1 | 10/2009 | Nagasaka |

FOREIGN PATENT DOCUMENTS

| | | |
|---|---|---|
| EP | 1 420 300 A3 | 5/2004 |
| EP | 1 760 528 | 3/2007 |
| EP | 1881520 A1 | 1/2008 |
| EP | 1895570 A1 | 3/2008 |
| JP | 2003161806 A * | 6/2003 |
| JP | 2005-150734 | 6/2005 |
| JP | 2006-310827 | 11/2006 |
| WO | 99/49504 A1 | 9/1999 |
| WO | WO 99/49504 A1 | 9/1999 |
| WO | WO 2005006415 A1 * | 1/2005 |
| WO | 2005101121 A2 | 10/2005 |
| WO | 2005/119742 | 12/2005 |
| WO | 2006/106907 | 10/2006 |
| WO | WO 2008031576 A1 * | 3/2008 |

OTHER PUBLICATIONS

Japanese Office Action mailed May 23, 2011 in corresponding Japanese Patent Application No. 2008-194809.

Taiwan Office Action dated Oct. 26, 2012 in corresponding Taiwan Patent Application No. 097129393.

Beckers et al., U.S. Appl. No. 12/216,669, filed Jul. 9, 2008.

* cited by examiner

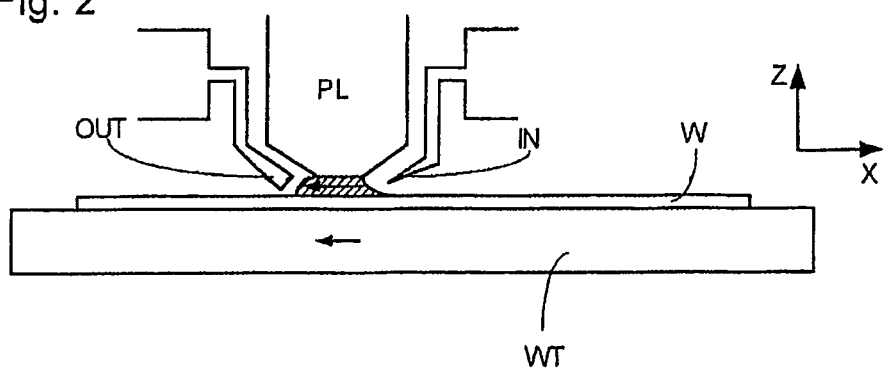
Fig. 2
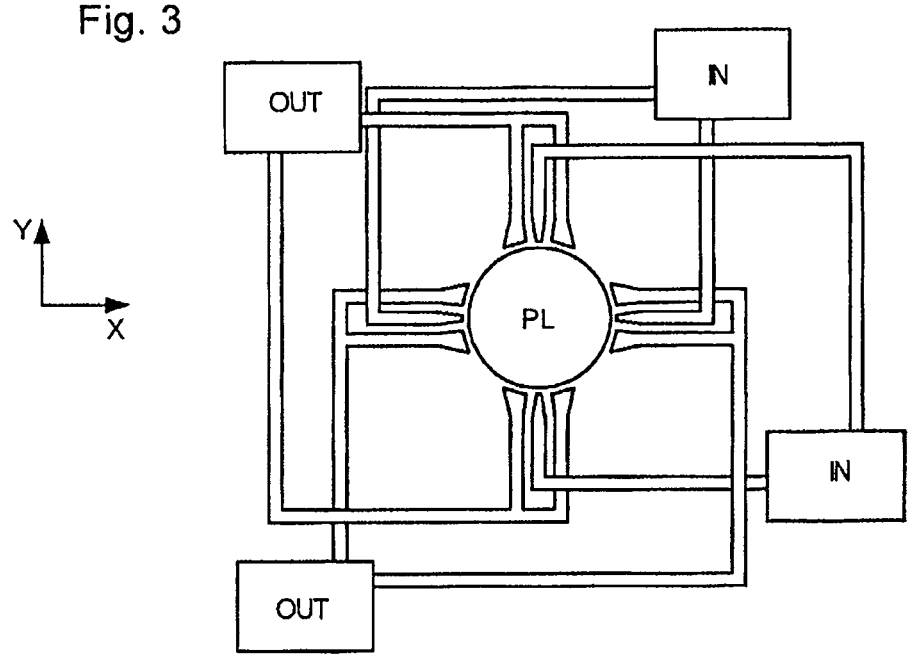
Fig. 3
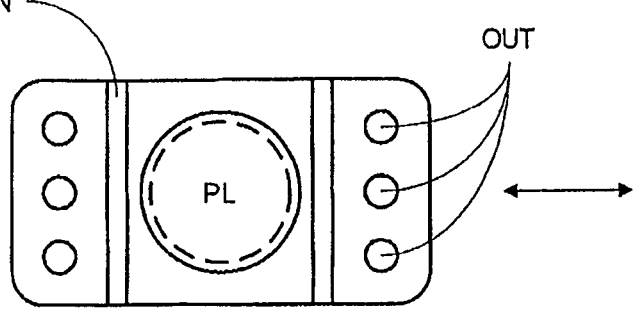
Fig. 4
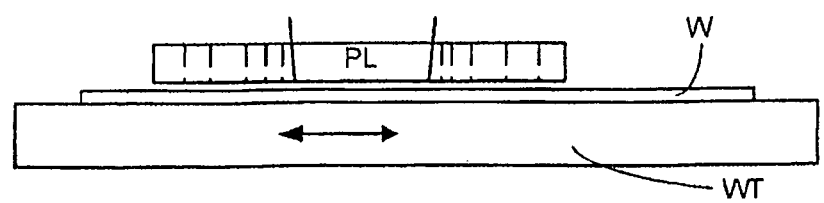

LITHOGRAPHIC APPARATUS AND DEVICE MANUFACTURING METHOD

This application claims priority and benefit to U.S. provisional patent application Nos. U.S. 60/935,247, filed Aug. 2, 2007, and U.S. 60/996,785, filed Dec. 5, 2007, each of the foregoing applications incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water (ultra pure water) although another high index liquid may be used. An embodiment of the present invention will be described with reference to liquid, e.g. a substantially incompressible and/or a wetting fluid. However, another fluid may be suitable, particularly a fluid with a higher refractive index than air, such as a hydrocarbon, such as a hydrofluorocarbon. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member, which extends along at least a part of a boundary of the space between the final element of the projection system and the substrate table. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such a system with a gas seal is disclosed in United States Patent Application Publication No. 2004-0207824, hereby incorporated in its entirety by reference.

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

Providing an immersion liquid between the projection system and the substrate for the patterned radiation beam to pass through presents particular challenges. For example, with a barrier member, control of the level of liquid in the space may be difficult. Too much liquid may cause overflow. With too little liquid, it is more likely that bubbles may be incorporated in the liquid (reservoir) between the projection system and the substrate.

SUMMARY

In some immersion lithographic apparatus, there is a gap between immersion system structure and the projection system (also known as the WELLE lens). A cooling gas stream flows over the projection system to maintain the temperature of the projection system. Some of the gas stream flows into the gap, over the immersion system, i.e. the liquid confinement system. An outer barrier may be used in an immersion system to prevent the gas stream from entering the gap, but in some apparatus, no outer barrier may be provided. However, the gas stream may disadvantageously cause the immersion liquid to evaporate, thereby applying a thermal load on the immersion system and the final projection system element. A thermal load may also or alternatively be created from the movement of gas on an underside of the final projection element. The thermal load may cause thermal (e.g., cold) spots in the final projection system element. The thermal spots may be detected as optical aberrations that differ from predicted aberration measurements. In addition or alternatively, immersion liquid may pass through this gap between the final projection system element and the immersion system, and some of the immersion liquid may escape through the gap.

During exposure, the substrate table is moved relative to the immersion system (and the projection system). This may cause the immersion liquid within the immersion system to move up the gap, e.g., in the direction of travel of the substrate. Thus, when the substrate is moved through a scanning or stepping motion, the direction of movement of the substrate changes. Because the immersion liquid in the gap moves with the movement of the substrate, the movement causes the level of the immersion liquid in the gap to change which may cause pressure differences. The movement of the immersion liquid is referred to as sloshing. If the movement is sufficiently large, the pressure on the immersion liquid may be sufficient to cause the liquid to overflow onto the top surface of the liquid confinement system. When the pressure decreases, liquid flows back into the gap, possibly taking with it unwanted contaminating particles present on the surface of the liquid confinement system. The liquid may be a source of defectivity and defects. Liquid may also be left on the top surface of the liquid confinement system, and on the surface of the final projection system element. The remaining liquid could evaporate and apply a thermal load to the respective surfaces.

In addition, the presence of the immersion liquid on the top surface of the liquid confinement system may cause damping between the liquid confinement system and the projection system as the immersion system is moved in a direction towards the projection system. Such damping may also be called bridging and is undesirable, because it may decrease the performance of the apparatus.

It is therefore desirable, for example, to alleviate one or more of the aforementioned problems or one or more other problems, by having a way to limit the movement of the immersion liquid in the gap, and to reduce the quantity of immersion liquid that escapes the immersion system through the gap.

It is an aspect of the present invention to provide a lithographic apparatus includes a projection system configured to project a patterned radiation beam onto a target portion of a substrate. The apparatus also includes a barrier member, surrounding a space between the projection system and, in use, the substrate, to define in part with the projection system a reservoir for liquid. A radially outer surface of the barrier member facing a portion of the projection system and a radially outer surface of the portion facing the barrier member each have a liquidphobic outer surface. The liquidphobic outer surface of the barrier member and/or the liquidphobic outer surface of the portion of the projection system has an inner edge that defines in part the reservoir.

It is an aspect of the present invention to provide a barrier member that is configured to surround a space between a projection system of a lithographic apparatus and, in use, a substrate, to define in part with the projection system a reservoir for liquid. A portion of the projection system has a radially outer surface that has a liquidphobic external layer. A radially outer surface of the barrier member is configured to face the liquidphobic external layer of the portion, and has a liquidphobic external layer. The liquidphobic external layer of the barrier member has an inner edge that defines in part the reservoir.

It is an aspect of the present invention to provide a lithographic apparatus that includes a projection system configured to project a patterned radiation beam onto a target portion of a substrate. A radially outer surface of a portion of the projection system facing the substrate has a UV absorbent layer and a liquidphobic external layer on a portion of the UV absorbent layer. There is a step function in the liquidphobic properties of the radially outer surface of the portion of the projection system. The step function is defined by a boundary between the liquidphobic external layer and the UV absorbent layer. The step function defines in part a reservoir for liquid in a space between the projection system and the substrate.

It is an aspect of the present invention to provide a device manufacturing method that includes projecting a patterned beam of radiation from a projection system through a liquid onto a target portion of a substrate. The method also includes confining the liquid in a space between the projection system and the substrate with a barrier member surrounding the space, an inner edge of a liquidphobic radially outer surface of the barrier member facing a portion of the projection system, and an inner edge of a liquidphobic radially outer surface of the portion of the projection system facing the barrier member.

It is an aspect of the present invention to provide a device manufacturing method that includes projecting a patterned beam of radiation from a projection system through a liquid onto a target portion of a substrate, and confining the liquid in a space between the projection system and the substrate with at least an inner edge of a liquidphobic radially outer surface of a portion of the projection system. The method also includes protecting the liquidphobic radially outer surface of the portion of the projection system with a UV absorbent layer in between the portion of the projection system and the liquidphobic radially outer surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
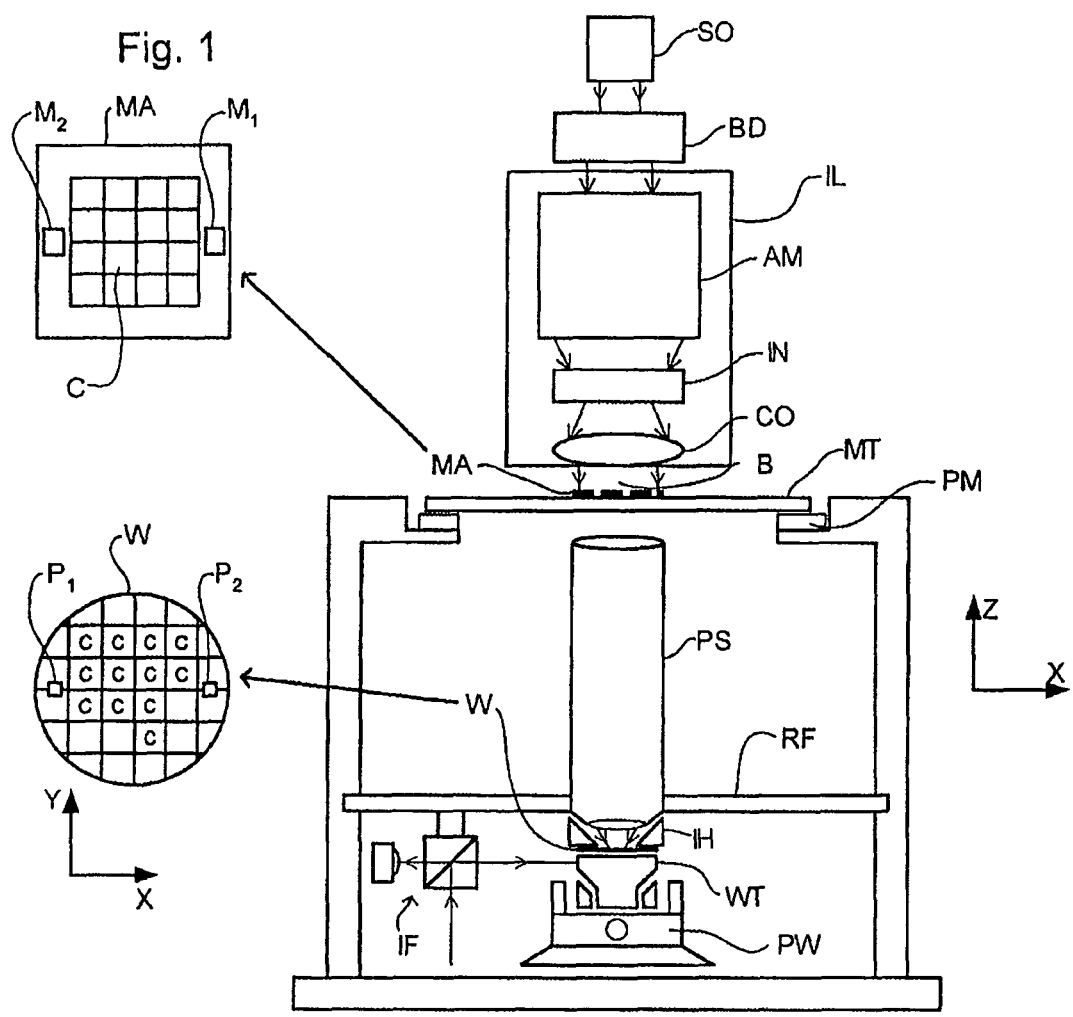
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or DUV radiation); a support structure (e.g. a mask table) MT constructed to support a patterning structure (e.g. a mask) MA and connected to a first positioner PM configured to accurately position the patterning structure in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 5:
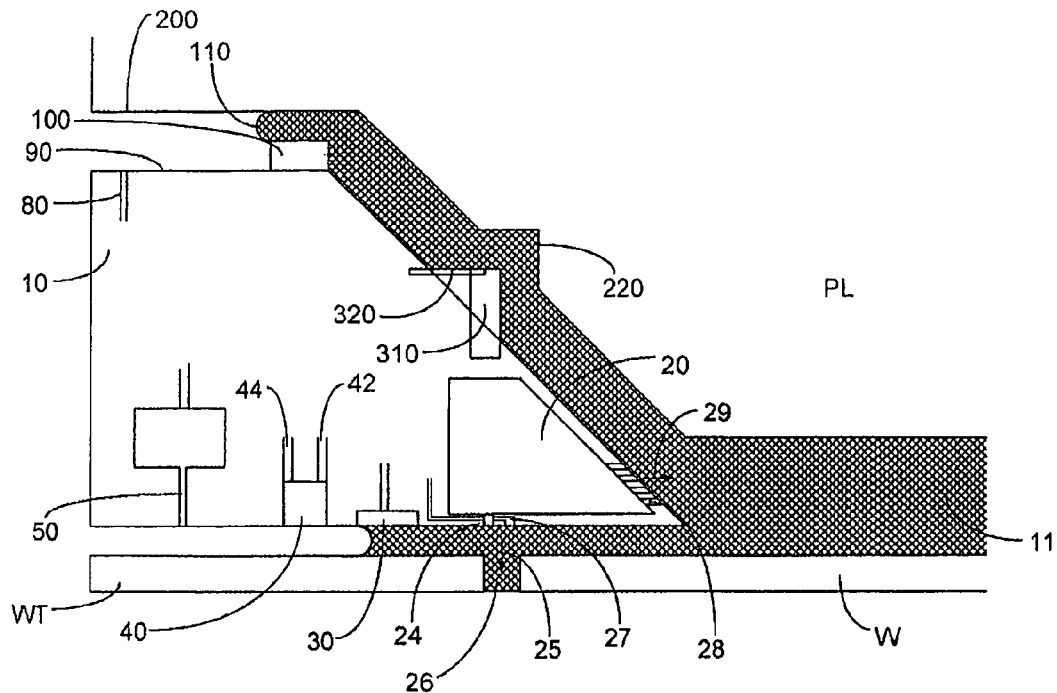
FIG. 5 depicts, in cross-section, a liquid supply system according to an embodiment of the invention.

FIG. 5 illustrates, in cross-section, a liquid supply system, which is shown in FIG. 1 as IH, in accordance with an embodiment of the invention. The liquid supply system comprises a barrier member 10 which at least partly or completely surrounds a space between the projection system PL and the substrate W and has a barrier surface that defines, along with the projection system PL and the substrate W (and/or the substrate table WT), a reservoir for the liquid 11. In this way, liquid 11 can be provided in that space so that the patterned radiation beam that is projected through the projection system PL onto the substrate W passes through the liquid 11.

In an embodiment, a contactless seal may be formed between the barrier member 10 and the substrate W (or substrate table WT when an edge of the substrate W is being imaged). In the illustrated embodiment, the contactless seal comprises a liquid removal device 30, a recess 40 radially outwardly of the liquid removal device which has, at a radially inwardly top surface, a gas inlet 42 and, at a radially outwardly surface, a gas outlet 44. An optional gas knife 50 may also be provided radially outwardly of the recess 40. The arrangement of these three items on the bottom surface of the barrier member 10 is described in detail in United States patent application publication no. US 2006-0158627, hereby incorporated in its entirety by reference. Details of the liquid removal device 30 are disclosed in United States patent application publication no. US 2006-0038968, hereby incorporated in its entirety by reference. Instead of or in addition to a contactless seal, and gas knife, the barrier member may have a series of gas drag apertures.

As shown in the embodiment represented by FIG. 5 (by way of example), liquid may be provided by the barrier member 10 to a chamber 20 at high pressure. The liquid enters the space between the projection system PL and the substrate W through one or more inlets 28 in a substantially horizontal direction (i.e. substantially parallel to the top surface of the substrate W as illustrated by arrow 29). Liquid also exits the chamber 20 through one or more inlets 24 which direct the flow of liquid in a direction away from the projection system PL vertically downwards as illustrated by arrow 25 (towards the substrate W). This flow of liquid is intended to fill a gap 26 which is usually present between the substrate W and the substrate table WT and also to keep the meniscus under the barrier member 10 radially outwardly of the inner side of the liquid removal device 30 especially during scanning of the substrate W under the barrier member 10. The filling of this gap 26 with the flow of liquid out of inlet 24 may reduce the occurrence of bubbles in that gap.

In an embodiment, the inlet 24 comprises a series of discrete holes positioned in a circle (or other shape around the image field of the projection system PL). The purpose of this inlet and these holes is to prevent the meniscus between the barrier member 10 and the substrate W from being drawn into the space between the projection system PL and the substrate W when an edge of the substrate W is being imaged or when the scan speed exceeds a certain magnitude. If gas (e.g., air) from the outward side of the meniscus is included under the projection system during relative movement of substrate W to the projection system PL, this may deleteriously affect the imaging quality. However, with a series of discrete holes, gas may get trapped between the holes and thereby build-up in the gap 26 between the substrate W and substrate table WT. Such bubbles may then enter the liquid 11 between the substrate W and the projection system PL. For this reason, one or more outlets 27 are also provided next to the inlet 24 and a mixture of gas and liquid is extracted through the outlet 27 so that gas trapped in the gap 26 can escape and liquid can fill the hole of the gap 26 without trapping gas bubbles. The outlet 27 may be connected to a chamber (not illustrated), such as the chamber 20, to reduce pressure fluctuations at the outlet 27. The outlet 27 may comprise a series of discrete holes positioned in a circle (or other shape around the image field of the projection system PL). In an embodiment, there is provided an inlet 24 that forms an outer perimeter of holes and an outlet 27 that forms an inner perimeter of holes so that when passing over the gap 26 the gap 26 is first filled by inlet 24 and then the bubbles are extracted by outlet 27. However, the precise positioning of the inlet 24 and outlet 27 may be otherwise so long as the function is achieved. The outlet 27 may also be used to extract liquid that could be contaminated by resist dissolving under the projection system. With such extraction the liquid near the meniscus (near the liquid removal device 30) will be less contaminated. The liquid that is left behind on the substrate W during scanning may then also be less contaminated and therefore the amount of particles left behind on the substrate may be reduced as may drying stains following liquid removal.

The barrier member 10 may be generally shaped to conform with the outer shape of the projection system PL such that a substantially constant gap exists between the projection system PL and the barrier member 10. A gap is present in order that independent relative movement of the projection system PL and barrier member 10 is possible.

In an embodiment, one or more measures are taken in order to deal with variations in the volume of the reservoir and variations in liquid supply/extraction from the reservoir. Under normal conditions, the top surface of the liquid 11 has a meniscus 110 which is substantially stationary relative to the projection system and the barrier member 10. The top surface 90 of the barrier member 10 is a horizontal surface which is flat and liquid is only allowed to be present on the top surface 90 in emergency situations. In order to deal with emergency situations, an outlet 80 is provided in the top surface 90. Once the meniscus 110 is on the top surface 90 it can advance easily and the barrier member 10 is likely to overflow. In order to prevent this, a protrusion 100 may be provided on the top surface 90 of the barrier member 10 at an inner most edge of the barrier member. The protrusion 100 may extend around the barrier member 10 and thus may form a ring or other enclosing shape. The protrusion 100 may be closer to the surface of the projection system PL, in particular the horizontal surface 200 of the projection system PL, than parts of the barrier member 10 surrounding the protrusion 100.

In an embodiment, there is a step change in distance from between the protrusion 100 and the projection system PL to between the barrier member 10 and the projection system PL. This step change can be seen on the left hand side of the protrusion 100 in FIG. 5. In an embodiment, this step change is on the radially outwardly side of the protrusion 100 but may also or optionally be present on the radially inward side of the protrusion 100 as is the case in FIG. 5. This geometry means that in order for the meniscus 110 of the top of the liquid 11 to pass the protrusion 100, the length of the meniscus 110 will need to increase which requires a great deal of energy. In an embodiment, surfaces of both the protrusion 100 and the projection system PL in the region of the protrusion are formed of liquid repellent or liquidphobic materials (e.g., the liquid makes a contact angle with those surfaces of generally greater than 90°, such as 100°, 110°, 120°, 130°, 140°, 150°, 160°, 170°, and 180°) such that the shape of the meniscus 110 is convex when viewed from outside of the liquid.

Thus, the provision of a step increase in the distance between the surface of the projection system PL and the barrier member 10 in a radially outward direction may significantly decrease the chances of overflow when using a barrier member 10.

The protrusion 100 is illustrated as being on the barrier member 10. However, this need not be the case and the protrusion may be on the projection system, so long as the same function (i.e. providing an energy barrier for the meniscus to overcome to move past the protrusion) is fulfilled.

Also illustrated in FIG. 5 is an embodiment of a system in which the inner surface of the barrier member 10 facing the projection system PL is deliberately misformed such that it more closely resembles the outer surface of the projection system PL which may also be deliberately misformed. In this way, a labyrinth is created for the liquid 11 to flow up towards the protrusion 100 from the substrate and this increases the flow restriction and thereby decreases the risk of overflowing. Thus, the path which the liquid would need to take in order to overflow over the barrier 10 would be tortuous and require at least three changes of direction. In the illustrated embodiment, this may be achieved by the provision of an indentation 220 in a side wall of the projection system PL. A protrusion may be provided on the inner side wall of the barrier member 10 (in the barrier surface), and may be formed by two elements 310, 320. Other measures can also be taken in order to increase the tortuousness of the path for liquid to follow from a position between the projection system PL and the substrate W to the top of the barrier member 10. The indentation 220 and/or elements 310, 320 may be used with or without the protrusion 100, and with or without the liquidphobic material discussed in greater detail below.

Figure 6:
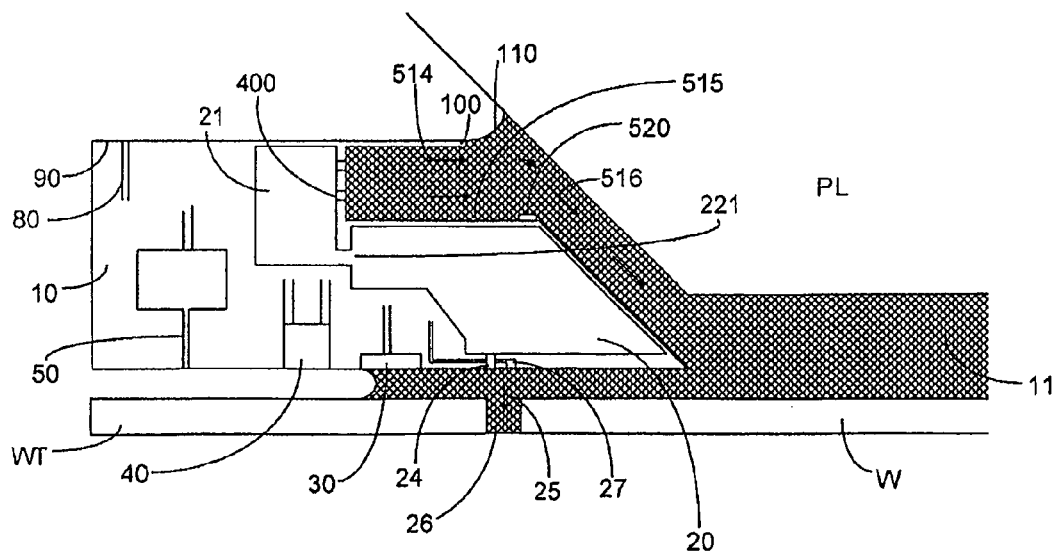
FIG. 6 depicts, in cross-section, a liquid supply system in accordance with a further embodiment of the invention.

FIG. 6 illustrates an embodiment that is the same as the embodiment described above in respect of FIG. 5, except as described below.

In this embodiment, instead of the provision of one or more inlets 28 which provide a flow of liquid into the space between the projection system PL and the substrate W in a substantially horizontal direction under the final element of the projection system, one or more inlets 400 are provided which provide a homogeneous flow of liquid at a low velocity against the side of the projection system PL. This flow is illustrated by arrows 514. The liquid which exits the inlet 400 is provided from a chamber 21 which is in fluid communication with the chamber 20. The provision of two chambers allows the pressure of liquid applied to inlet 400 and to inlet 24 to be different. The pressure can be adjusted by varying the size and/or number of holes 221 which connect the chambers 20 and 21.

The protrusion 100 in this embodiment is similar to that as described above in respect of FIG. 5 in that the meniscus 110 of liquid 11 extends between the protrusion 100 and the projection system PL. Although the construction of the protrusion 100 in this embodiment is different, the same principles apply. That is, the protrusion is closer to the projection system PL than other parts of the barrier member 10 in close proximity, such that for the meniscus 110 to pass the protrusion 100 the length of the meniscus should increase greatly.

The horizontal flow of liquid is prevented from being sucked downwards towards the substrate W by the presence of a second protrusion 520 at the radially inner most edge of the horizontal portion 515 below where the inlet 400 exits. This allows the horizontal flow of liquid 514 to be deflected by a surface of the projection system PL to create a flow 516 downwards and radially inward, starting from above a bottom surface of the projection system PL.

This arrangement overcomes a disadvantage of the tendency of the inlet 28 of the embodiment described in respect of FIG. 5 to create a strong downward flow which can draw the meniscus 110 downwards, thereby leading to a possibly unstable meniscus position. An unstable meniscus may result in gas entrapment in the liquid supply as a large tongue of gas may extend under the projection system PL when the liquid supply rate exceeds a certain value. Avoidance of such a disadvantage may be achieved in this embodiment because this embodiment may allow for a lowering of the outflow velocity from inlet 400 in comparison to that from inlet 28. The embodiment may also allow for the barrier member 10 to be positioned closer to the projection system PL. The protrusion 100 may help ensure that the meniscus 110 is as short as possible. Thus, a great quantity of energy would be needed to draw the meniscus 110 downwards where the length of the meniscus would need to be increased.

Figure 7:
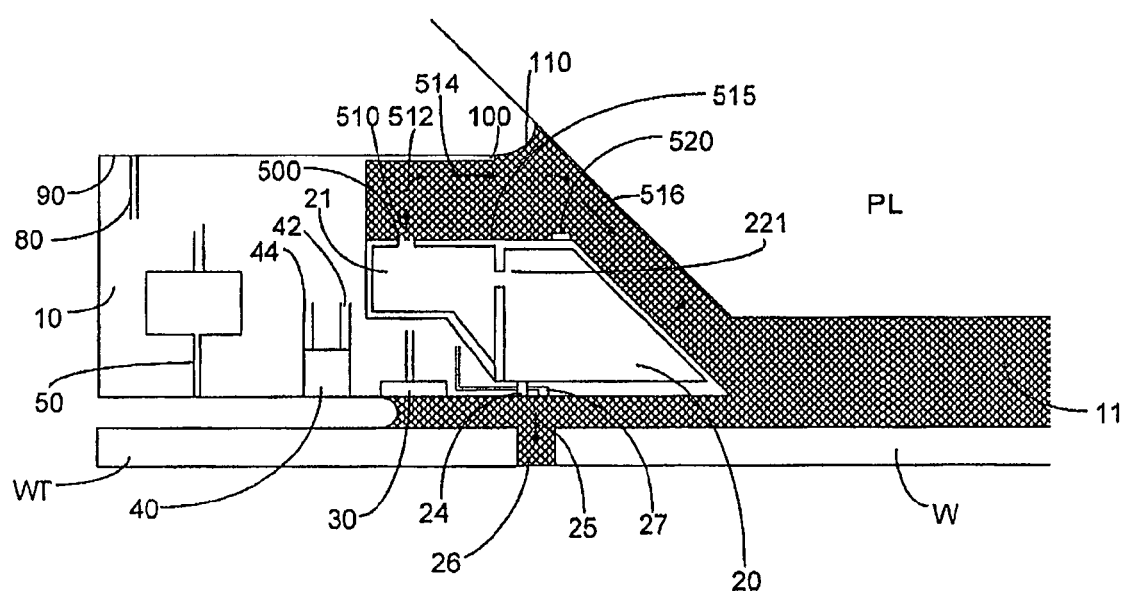
FIG. 7 depicts, in cross-section a liquid supply system in accordance with a further embodiment of the invention.

FIG. 7 illustrates an embodiment that is the same as the embodiment described with respect to FIG. 6, except as described below.

In this embodiment, the location of the inlet is different. In the previous embodiment, the location of the inlet 400 provides a flow of liquid into the space between the projection system PL and the substrate W in a substantially horizontal direction. In this embodiment, an inlet 500 is provided which provides a flow of liquid into the space defined between the substrate W, the projection system PL and the barrier member 10 in a direction away from the substrate W (i.e., in a direction opposite to the direction of propagation of the patterned radiation beam) as illustrated by arrow 510. The liquid which exits the inlet 500 is provided from a chamber 21 which is in fluid communication with the chamber 20 as described above with respect to FIG. 6.

The flow of liquid exiting the inlet 500 may be deflected by protrusion 100 to a direction radially inwardly and substantially parallel to the top surface of the substrate W as in the embodiment described above with respect to FIG. 6. This is illustrated by arrows 512, 514. The protrusion 100 in this embodiment is similar to that of the other embodiments in that the meniscus 110 of liquid 11 may extend between the protrusion 100 and the projection system PL. Although the construction of the protrusion 100 in this embodiment is different to that of the embodiment described above with respect to FIG. 5, the same principles apply, i.e. that the protrusion is closer to the projection system PL than other parts of the barrier member 10 in close proximity such that in order for the meniscus 110 to pass the protrusion 100, the length of the meniscus would need to increase greatly.

After the flow 510 is deflected by the protrusion 100, the flow is homogenized as in the embodiment described above with respect to FIG. 6 and flows at a relatively slow speed substantially horizontally against the projection system PL. The protrusion 100 may help ensure that the meniscus 110 is as short as possible so a great quantity of energy would be needed to draw the meniscus 110 downwards to increase the length of the meniscus. This embodiment may be advantageous over the embodiment described above with respect to FIG. 6 because it may use less space.

In all of the embodiments described above, cross-sections have been shown of the barrier member 10. The barrier member 10 is not necessarily symmetrical around its entire periphery and it could be, for instance, that the inlets 28, 400, 500 are provided only around a fraction of a periphery of the barrier member 10 and that a system for extraction of immersion liquid is provided around other parts. Such an arrangement can lead to a flow of liquid 11 across the space between the projection system PL and the substrate W in a single direction. Other arrangements are also possible and the principles described above in relation to the above described embodiments may also be applied to other types of liquid supply system. It will be clear that features of any embodiment herein may be used in conjunction with some or all features of any other embodiment herein.

Figure 8:
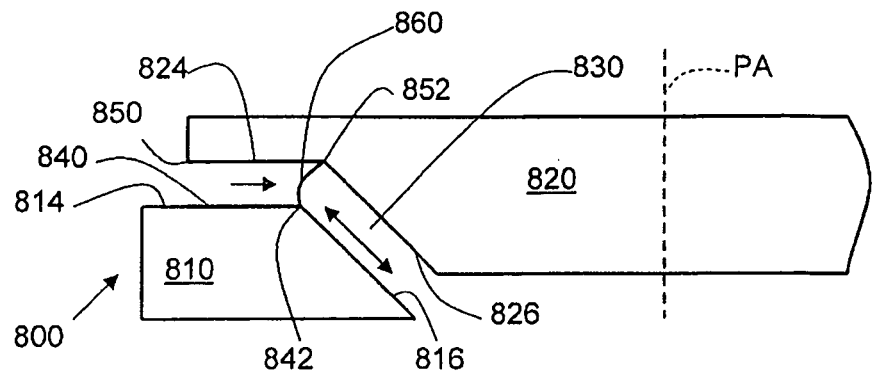
FIG. 8 depicts a cross-section of a liquid confinement system and a portion of the projection system according to an embodiment of the invention.

FIG. 8 illustrates an embodiment of a liquid confinement system 800 that is configured to substantially confine immersion fluid to a desired volume between the projection system and the substrate. The immersion fluid is desirably a liquid that has a refractive index that is equal to or greater than the refractive index of pure water. The liquid confinement system 800 includes a barrier member 810 having a radially outer surface, i.e., a surface that is located radially outward from a projection axis PA of the beam of radiation that is projected by the projection system PS, as described above in reference to FIG. 1. The radially outer surface of the barrier member 810 includes a substantially horizontal top surface 814 and an inclined top surface 816 that is inclined relative to the horizontal top surface 814 and the projection axis PA. The barrier member 810 is spaced from a portion 820 of the projection system so as to define a gap 830 therebetween.

The portion 820 of the projection system may be the final element of the entire projection system, or may be the final element of an intermediate projection system that is in contact with liquid. The portion 820 of the projection system includes a radially outer surface (i.e., a surface that is located radially outward from a projection axis PA) that includes a substantially horizontal surface 824 that is opposite the substantially horizontal top surface 814 of the barrier member 810, and an inclined surface 826 that is opposite the inclined surface 816 of the barrier member 810. The lower surface of the portion 820 of the projection system and the top surface of the barrier member 810 may be shaped to cooperate with each other.

In the embodiment shown in FIG. 8, the top surface of the immersion system (e.g., the barrier member 810 of the liquid confinement system 800) may have a liquid repellent or liquidphobic (e.g., hydrophobic, when the immersion liquid is water) external layer 840, which may be in the form of a coating. In an embodiment, the barrier member 810 may be made from a liquidphobic material that provides a liquidphobic or liquid repellent surface. The term "layer" as used herein should be broadly construed to include a surface that is an integral part of the member as well as a surface that is provided in the form of a coating and is thus not necessarily an integral part of the member. The liquidphobic external layer 840 may be annularly continuous or discontinuous as it extends from the projection axis PA. In an embodiment, the liquidphobic external layer 840 may be patterned so as to create a surface that is discontinuous in its liquidphobic properties.

During sloshing, the liquidphobic external layer 840 can help prevent the immersion liquid from accessing the substantially horizontal top surface 814 of the barrier member 810. This prevention of access may reduce the quantity of contaminant particles found in the immersion liquid in the reservoir. One end of a meniscus 860 of the immersion liquid may be pinned to an edge 842 of the liquidphobic external layer 840 due to a step function change in surface properties at the edge 842. In other words, because the contact angle between the immersion liquid and the liquidphobic external layer is greater than 90 degrees, e.g. between 90 degrees and 180 degrees, and the contact angle between the surface of the barrier member 810 that does not include the liquidphobic external layer is less than about 90 degrees, e.g., between 0 degrees and 90 degrees, thereby creating a step function change, the meniscus 860 is not likely to rise above the edge 842. The term "edge" as used herein is intended to describe an end of the liquidphobic external layer 840 that is closest to the immersion liquid reservoir that is contained in between the projection system and the substrate, without imparting any particular physical structure or shape.

If the pressure applied to the immersion liquid is sufficiently great, for example, during movement of the substrate table, liquid can break free of its pinning, and escape onto the liquidphobic external layer 840. However, because the layer 840 has liquidphobic properties, the layer 840 may repel the liquid, desirably back beyond the edge 842 of the layer 840. Substantially no immersion liquid may be allowed to remain on the liquidphobic external layer 840 and thus reduce the evaporation and thermal load applied to the apparatus.

As shown in FIG. 8, the substantially horizontal surface 824 of the radially outer surface of the portion 820 of the projection system may include a liquidphobic external layer 850 that is configured to repel liquid. In the illustrated embodiment, the liquidphobic external layer 850 has an edge 852 that is located at or near an intersection of the substantially horizontal surface 824 and the inclined surface 826 of the portion 820 of the projection system. The location of the edge 852 of the liquidphobic external layer 850 of the portion 820 of the projection system relative to the edge 842 of the liquidphobic external layer 840 of the barrier member 810 may allow the meniscus 860 of the immersion liquid to be pinned at the edge 852. Similar to the liquidphobic external layer 840, the liquidphobic external layer 850 may be annularly continuous or discontinuous as it extends from the projection axis PA. In an embodiment, the liquidphobic external layer 850 may be patterned so as to create a surface that is discontinuous in its liquidphobic properties.

The liquidphobic external layers 840, 850 may include any suitable liquidphobic material. For example, in an embodiment, the liquidphobic external layers 840, 850 may include polytetrafluoroethylene, e.g., TEFLON®. The liquidphobic external layers 840, 850 may be applied to their respective surfaces in the form of a coating or may be applied with a sticker or laminating material that includes such a coating.

Figure 9:
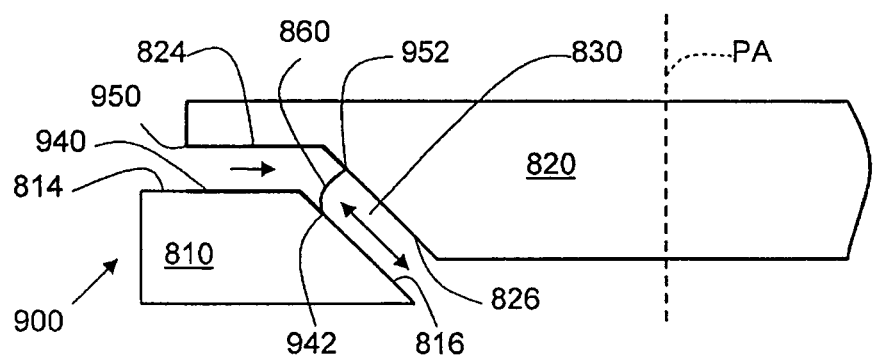
FIG. 9 depicts a cross-section of a liquid confinement system and a portion of the projection system according to an embodiment of the invention.

FIG. 9 illustrates an embodiment of a liquid confinement system 900, having some of the features of the liquid confinement system 800 of FIG. 8, as indicated by corresponding reference symbols. The liquid confinement system 900 includes a liquidphobic external layer 940 that may be applied to the top surface of the barrier member 810, and may cover the substantially horizontal surface 814, as well as a portion of the inclined top surface 816 of the barrier member 810. One end of the meniscus 860 of the immersion liquid is thus pinned to an edge 942 of the liquidphobic external layer 940, which is located on the inclined surface 816.

As discussed above, if the pressure applied to the immersion liquid is sufficiently great, for example, during movement of the substrate table, liquid may still be able to break free of its pinning. However, because the layer 940 has liquidphobic properties, substantially no immersion liquid may be allowed to remain on the liquidphobic external layer 940 and thus reduce the evaporation and thermal load applied to the apparatus.

As shown in FIG. 9, the substantially horizontal surface 824 as well as a portion of the inclined surface 826 of the radially outward surface of the portion 820 of the projection system may include a liquidphobic external layer 950 that is configured to repel liquid. As illustrated, the liquidphobic external layer 950 has an edge 952 which allows the meniscus 860 of the immersion liquid to be pinned at edge 952. In an embodiment, edge 952 is located substantially opposite the edge 942 (i.e., across the gap 830) of the liquidphobic external layer 940 provided on the barrier member 810. This may allow the meniscus 860 of the immersion liquid to be pinned at both edges 942, 952.

Figure 10:
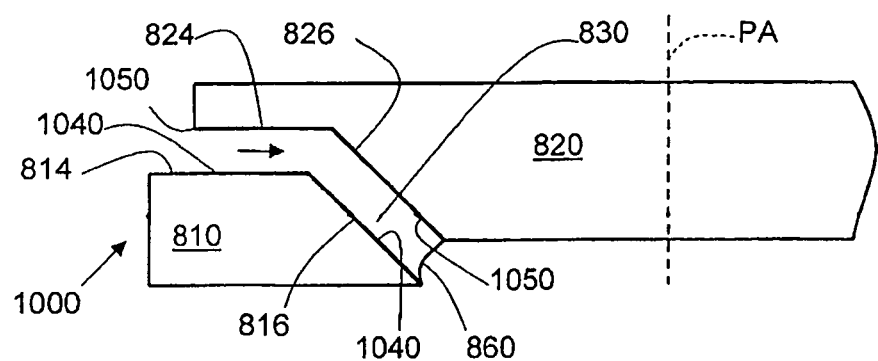
FIG. 10 depicts a cross-section of a liquid confinement system and a portion of the projection system according to an embodiment of the invention.

FIG. 10 illustrates an embodiment of a liquid confinement system 1000, having some of the same features of the liquid confinement system 800 of FIG. 8, as indicated by corresponding reference symbols. The liquid confinement system 1000 includes a liquidphobic external layer 1040 for the top surface of the barrier member 810, including the substantially horizontal surface 814, as well as all of, or substantially all of the inclined top surface 816. One end of the meniscus 860 of the immersion liquid may be pinned to an edge 1042 of the liquidphobic external layer 1040, which is located at the bottom of the inclined surface 816, if the level of the immersion liquid is sufficiently low. Otherwise, one end of the meniscus 860 may move up the inclined surface 816, but the contact angle will be such that a thin film of the immersion liquid may not form on the surface 816.

As shown in FIG. 10, the substantially horizontal surface 824 as well as all of, or substantially all of the inclined surface 826 of the radially outward surface of the portion 820 of the projection system may include a liquidphobic external layer 1050 that is configured to repel liquid. As illustrated, the liquidphobic external layer 1050 has an edge 1052 that is located at the bottom end of the inclined surface 826 of the portion 820 of the projection system. Similar to the liquidphobic external layer 1040 provided on the barrier member 810, the liquidphobic external layer 1050 provided on the portion 820 of the projection system may prevent a thin film of immersion liquid from being formed on the inclined surface 826 of the portion 820 of the projection system, which may reduce the amount of immersion liquid that may evaporate and thus reduce cold spots on the portion 820 of the projection system.

As discussed above, the edge of the liquidphobic external layer may be at an inner edge of the substantially horizontal top surface of the barrier member 810, as shown in FIG. 8, or near the top of the inclined surface, as shown in FIG. 9. The liquidphobic external layer may cover the entire inclined surface (or cone surface), as shown in FIG. 10. The edge of the liquidphobic external layer may be at any position intermediate of any two of these three embodiments; the edge may be located on the horizontal top surface 814 of the barrier member 810. Desirably, the liquidphobic external layer covers all of the horizontal part of the top surface and, possibly, the entire surface between the edge of the horizontal surface and the edge of a liquidphilic (e.g., hydrophilic) surface. The surface may be a coating applied to a body of the liquid confinement system, including but not limited to the barrier member discussed above. The body, or one or more parts thereof, may be made of a material that is liquidphilic and/or liquidphobic. References herein to a liquidphobic and/or liquidphilic layer or coating should be understood as to include a surface made of liquidphobic and/or liquidphilic material. The inclined surface below the edge of the liquidphobic surface may be exposed material of the body and so be liquidphilic.

Figure 11:
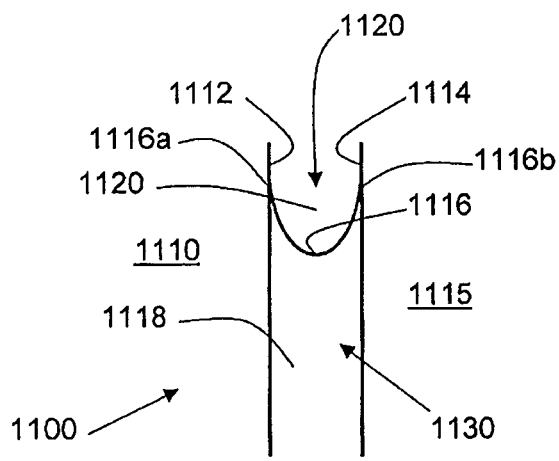
FIG. 11 depicts a schematic diagram of the behavior of a liquid meniscus on a surface having a low contact angle.

FIG. 11 illustrates a liquid confinement system 1100 that has a body 1110 that has a surface 1112 that is liquidphilic (i.e. creates a contact angle with a liquid of between about 0 degrees and about 90 degrees, typically between about 40 degrees and about 50 degrees). The liquidphilic surface 1112 is illustrated to be opposite another liquidphilic surface 1114, which may be provided on another part 1115 of an apparatus, such as a final element of the projection system, so as to define a gap 1130. As illustrated, the liquidphilic surface 1112 of the body 1110 draws an edge 1116a of a meniscus 1116 of an immersion liquid 1118 to the surface 1112 of the liquid confinement system 1100. Similarly, the liquidphilic surface 1114 draws an edge 1116b of the meniscus 1116 of the immersion liquid 1118 to the surface 1114. As illustrated in FIG. 11, the liquidphilic surfaces 1112, 1114 cause the immersion liquid 1118 that comes into contact therewith to be thinned into respective thin films, which cause a surface of the liquid, defined by the meniscus 1116, that is exposed to a gas 1120 (e.g., air) to be increased. This may cause the rate of evaporation to increase, which may increase the applied thermal load to the liquid confinement system 1100 and/or other part of the apparatus that includes the liquidphilic surface 1114. In some cases, the rate of evaporation may be so great that the evaporating liquid draws up, for example by capillary action and so replenishing the thin liquid film. Thus, a problem that may occur during sloshing may also occur when the substrate table is stationary relative to the projection system. Pinning by an edge of a liquidphobic surface, or simply providing the liquidphobic surface itself may assist the reduction of thermal load applied to the immersion system and/or the projection system, even when the respective components of the apparatus are at rest.

Figure 12:
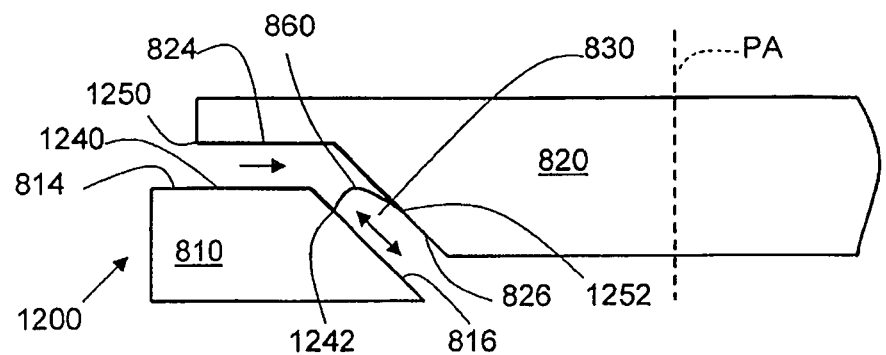
FIG. 12 depicts a cross-section of a liquid confinement system and a portion of the projection system according to an embodiment of the invention.

FIG. 12 illustrates an embodiment of a liquid confinement system 1200, having some of the features of the liquid confinement system 800 of FIG. 8, as indicated by corresponding reference symbols. The liquid confinement system 1200 includes a liquidphobic external layer 1240 of the top surface of the barrier member 810, specifically, the substantially horizontal surface 814, as well as a portion of the inclined top surface 816. One end of the meniscus 860 of the immersion liquid may be pinned to an edge 1242 of the liquidphobic external layer 1240, which is located on the inclined surface 816.

If the pressure applied to the immersion liquid is sufficiently great, for example, during movement of the substrate table, liquid may still be able to break free of its pinning, and escape onto the liquidphobic external layer 1240. However, because the layer 1240 has liquidphobic properties, the layer 1240 may repel the liquid, desirably back beyond the edge 1242 of the layer 1240. Desirably, substantially no immersion liquid is allowed to remain on the liquidphobic external layer 1240 and thus reduce the evaporation and thermal load applied to the apparatus. If the pressure applied to the immersion liquid is sufficiently great and/or the level of the immersion liquid in the reservoir is such that the meniscus 860 will rise into the gap 830, the contact angle may be sufficiently great so as to prevent a thin film from developing on the inclined surface 816 of the barrier member 810.

As shown in FIG. 12, the substantially horizontal surface 824 as well as a portion of the inclined surface 826 of the radially outward surface of the portion 820 of the projection system may include a liquidphobic external layer 1250 that is configured to repel liquid. As illustrated, the liquidphobic external layer 1250 has an edge 1252 configured to pin the meniscus 860 at edge 1252. In an embodiment, edge 1252 is located substantially opposite the gap 830 from and substantially horizontal to the edge 1242 of the liquidphobic external layer 1240 of the barrier member 810. This arrangement provides a greater coverage of the liquidphobic external layer 1250 on the inclined surface 826, as compared to the embodiment illustrated in FIG. 9. This may allow the meniscus 860 of the immersion liquid to be pinned at both edges 1242, 1252. Depending on the level of the immersion liquid in the gap 830, it is possible that the immersion liquid will not be pinned at the edge 1252, but will instead rise above the edge 1252. However, due to the liquidphobic properties of the liquidphobic external layer 1250, the immersion liquid may not stick to the liquidphobic external layer 1250.

In an embodiment, the liquidphobic external layer is desirably provided on at least the entire surface of the portion of the projection system that opposes the liquidphobic external layer provided on the liquid confinement structure of the immersion system. As illustrated in the above-described embodiments, the extent of coverage by the liquidphobic surface of each of the portion of the projection system and the liquid confinement surface may differ, such that the edges of the opposing liquidphobic surfaces may not correspond across the gap between the liquid confinement system and the projection system. This may have an advantage for meniscus stability, and may minimize the area of the meniscus exposed to the gas flow. The edges may be selected to optimize (e.g., minimize) the liquid evaporation and the thermal load applied to the projection system and/or immersion system.

In an embodiment, the edge of the liquidphobic external layer may be distinct, desirably providing an abrupt discontinuity in contact angle. As discussed above, the edge may be considered as step function in the liquidphobic properties, i.e. the contact angle, of the respective surface.

In an embodiment, the edge may be defined as a gradual change in contact angle between a region that is not liquidphobic (i.e., liquidphilic) and a region that has a substantially constant liquidphobic contact angle. For example, the edge region may have a gradually changing contact angle that increases with distance away from the axis of the optical path (i.e., the projection axis PA). Desirably, the contact angle changes from the contact angle of the non-liquidphobic surface to the contact angle provided on the liquidphobic surface. The region of the surface with a gradually changing contact angle may have a well-defined edges, or may have a roughened surface that provides a disruption in the contact surface between the liquid and the liquidphobic external layer. By having well-defined edges, better control of meniscus pinning may be achieved. The well-defined boundaries of the edge may be considered as a step function in the rate of change of the liquidphobic properties of the surface with displacement from the optical axis, as discussed above.

In an embodiment, the barrier member of the liquid confinement system may have a projection, as described above. However, adequate performance may be achieved by controlling the liquid meniscus by having an appropriate liquidphobic surface. As discussed above, the surface may be a coating that is applied directly to the barrier member and/or the portion of the projection system, or the surface may be a sticker having an external liquidphobic surface. The sticker may be applied directly to a surface of the projection system and/or the immersion system, e.g., the liquid confinement system. The sticker may be shaped to fit the intended surface. The liquidphobic surface desirably has a contact angle of 90 degrees or more, i.e. between 90 degrees and 180 degrees. For example, the contact angle may be 90 degrees, 100 degrees, 110 degrees, 120 degrees, 130 degrees, 140 degrees, 150 degrees, 160 degrees, 170 degrees, 180 degrees, etc. Improved pinning performance (for example at faster scanning and stepping speeds) may be achieved by using a surface with a contact angle of 100 degrees or more.

As discussed above, application of the liquidphobic coating to the aforementioned surfaces may prevent evaporation of the immersion liquid, especially from the surface of the final element of the projection system. The optical aberration caused by thermal fluctuation in the final element may be reduced. Increase in system performance may be achieved by reducing the thermal load applied through unwanted evaporation on the top surface of the liquid confinement system of the immersion system.

It should be noted that the positioning of the liquidphobic external layers may allow liquid to substantially enter the gap 830 between the portion 820 of the projection system and the barrier member 810. In an embodiment, the length to width ratio of the gap supplied with liquid in the embodiments described above is equal to or less than 10:1, and desirably equal to or less than 5:1. This may limit the amount of sloshing by affecting the pressure applied to the liquid during exposure movements.

Some liquidphobic surfaces are known to be affected by UV radiation. As UV radiation may be used in, for example, exposure in a lithographic apparatus, the liquidphobic surface may be damaged by such radiation unless it is protected, e.g., shielded.

Figure 13:
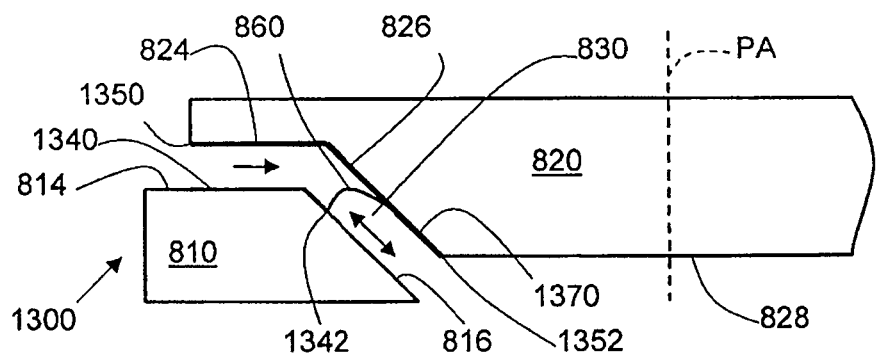
FIG. 13 depicts a cross-section of a liquid confinement system and a portion of the projection system according to an embodiment of the invention.

FIG. 13 illustrates an embodiment of a liquid confinement system 1300, having some of the features of the liquid confinement system 800 of FIG. 8, as indicated by corresponding reference symbols. The liquid confinement system 1300 includes a liquidphobic external layer 1340, which may cover the substantially horizontal surface 814, as well as a portion of the inclined top surface 816 of the barrier member 810. One end of the meniscus 860 of the immersion liquid may be pinned to an edge 1342 of the liquidphobic external layer 1340, which is located on the inclined surface 816.

As shown in FIG. 13, the substantially horizontal surface 824 as well as the inclined surface 826 of the radially outward surface of the portion 820 of the projection system may include a liquidphobic external layer 1350 that is configured to repel liquid. As illustrated, the liquidphobic external layer 1350 has an edge 1352 that is located at an intersection of the inclined radially outward surface 826 and a bottom substantially horizontal surface 828 of the portion 820 of the projection system (i.e., at the bottom of the inclined surface 826). As illustrated in FIG. 13, the portion 820 of the projection system also includes a UV absorbent layer 1370 that is provided in between the surface of the portion 820 of the projection system itself and the liquidphobic external layer 1350. In an embodiment, portion 820 is the final element of the projection system. In an embodiment, the portion 820 is transmissive (e.g., fused silica or calcium fluoride). In an embodiment, the portion 820 is the final element of the projection system and the final element is made of transmissive material.

The UV absorbent layer 1370 is desirably provided as a coating. The UV absorbent layer 1370 may be applied to the surface of the portion 820 of the projection system prior to application of the liquidphobic external layer 1350, such that the UV absorbent layer 1370 is in between the portion 820 of the projection system and the liquidphobic external layer 1350. The UV absorbent layer may prevent unwanted radiation from reaching each of the liquidphobic external layers 1350, 1340 on the portion 820 of the projection system and the barrier member 810, respectively, and may protect and lengthen the life of the liquidphobic external layers 1340, 1350, particularly if the liquidphobic external layers 1340, 1350 are UV susceptible. The UV absorbent layer 1370 may not be liquidphobic, or may not be liquidphobic to the same extent as the surface of the liquidphobic external layer 1350 that is provided on the portion 820 of the projection system. In an embodiment, the UV absorbent layer may have a liquidphilic surface property. A liquidphobic material that is not adversely affected by UV radiation may be applied directly to the portion of the projection system without the use of the UV absorbent layer, as described in embodiments above.

In the embodiment illustrated in FIG. 13, the UV absorbent layer 1370 at least covers the same area of the surface of the portion 820 of the projection system as the liquidphobic external layer 1350 so that an edge 1372 of the UV absorbent layer 1370 is located at the same position as the edge 1352 of the liquidphobic external layer 1350. The UV absorbent layer 1370 may be placed at other parts of the lithographic apparatus to protect the liquidphobic external layers 1340, 1350. Because UV radiation may reflect and refract within the projection system and the immersion system, scattering as stray radiation through the immersion liquid, it may be beneficial for the UV absorbent layer 1370 to cover the maximum possible surface of the portion 820 of the projection system, without obscuring the path of the exposure beam, to prevent unwanted reflection and refraction of the projected radiation. Otherwise, stray radiation may interact with the liquidphobic external layers 1340, 1350, and the life of the liquidphobic external layers 1340, 1350 may be reduced. The effect of the UV absorbent layer 1370 may be maximized if the UV absorbent layer 1370 is provided to the substantially horizontal radially outward surface 824 of the portion 820 of the projection system and the inclined radially outward surface 826 of the portion 820 of the projection system as well.

Figure 14:
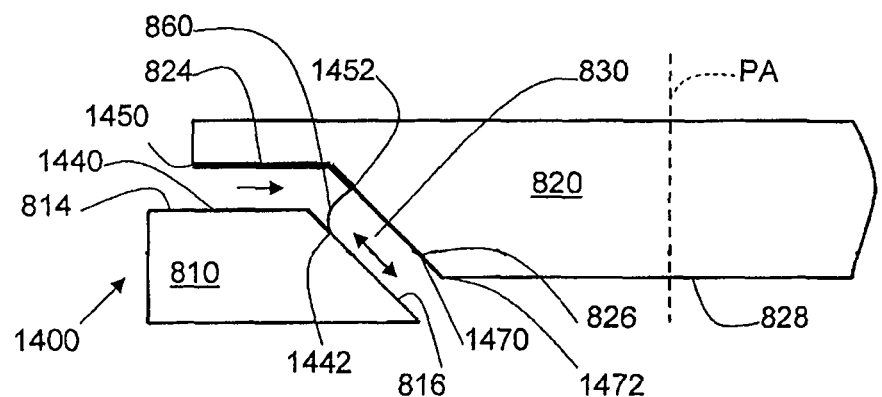
FIG. 14 depicts a cross-section of a liquid confinement system and a portion of the projection system according to an embodiment of the invention.

To achieve the maximum UV protection for a liquidphobic external layer, and to minimize the thermal load applied to the system through evaporation, the UV absorbent layer may cover a greater area of the portion of the projection system than the liquidphobic external layer, as shown in FIG. 14, and described in further detail below.

FIG. 14 illustrates an embodiment of a liquid confinement system 1400, having some of the features of the liquid confinement system 800 of FIG. 8, as indicated by corresponding reference symbols. The liquid confinement system 1400 includes a liquidphobic external layer 1440 that may be applied to the top surface of the barrier member 810. In the embodiment illustrated in FIG. 14, the liquidphobic external layer 1440 may cover the substantially horizontal surface 814, as well as a portion of the inclined top surface 816 of the barrier member 810. One end of the meniscus 860 of the immersion liquid may be pinned to an edge 1442 of the liquidphobic external layer 1440, which is located on the inclined surface 816.

The substantially horizontal surface 824 as well as the inclined surface 826 of the radially outward surface of the portion 820 of the projection system may include a liquidphobic external layer 1450 that is configured to repel liquid. The liquidphobic external layer 1450 has an edge 1452 which allows an end of the meniscus 860 to be pinned to the edge 1452. In an embodiment, and as illustrated, the liquidphobic external layer 1450 has an edge 1452 that is located opposite the edge 1442 of the liquidphobic external layer 1440 that is provided on the barrier member 810.

As illustrated in FIG. 14, the portion 820 of the projection system also includes a UV absorbent layer 1470 that is provided in between the surface of the portion 820 of the projection system itself and the liquidphobic external layer 1450. The UV absorbent layer 1470 is desirably provided as a coating. The UV absorbent layer may be applied to the surface of the portion 820 of the projection system prior to application of the liquidphobic external layer 1450, such that the UV absorbent layer 1470 is in between the portion 820 of the projection system and the liquidphobic external layer 1450. As illustrated in FIG. 14, the UV absorbent layer 1470 is provided on substantially all of the radially outward surface of the portion 820 of the projection system; that is, on the substantially horizontal surface 824 and the inclined surface 826. Thus, an edge 1472 (i.e. end) of the UV absorbent layer 1470 is located at or substantially near an intersection of the inclined surface 826 and the bottom surface 828 of the portion 820 of the projection system. As above, the UV absorbent layer prevents unwanted radiation from reaching each of the liquidphobic external layers 1440, 1450, and therefore may protect and lengthen the life of the liquidphobic external layers 1440, 1450. The UV absorbent layer 1470 may not be liquidphobic or liquidphobic to the same extent as the surface of the liquidphobic external layer 1450 provided on the portion 820 of the projection system and may be liquidphilic.

At the boundary at the edge 1452 of the liquidphobic external layer 1450 and the surface of the UV absorbent layer 1470, there may be a step function in liquidphobic properties. That is, as discussed above, there may a sudden change in contact angle, or a change from a contact angle that is substantially constant with respect to distance from the projection axis PA (i.e. optical axis) to a contact angle that changes with displacement away from the projection axis PA of the projection system (desirably one that increases with increasing displacement). Therefore, a surface that has both coatings, such as the inclined surface 826 of the portion 820 of the projection system, may have a discontinuous feature which may act as a barrier to control immersion liquid movement on the surface 826 also and provide prevention of unwanted reflection and refraction of UV.

Figure 15:
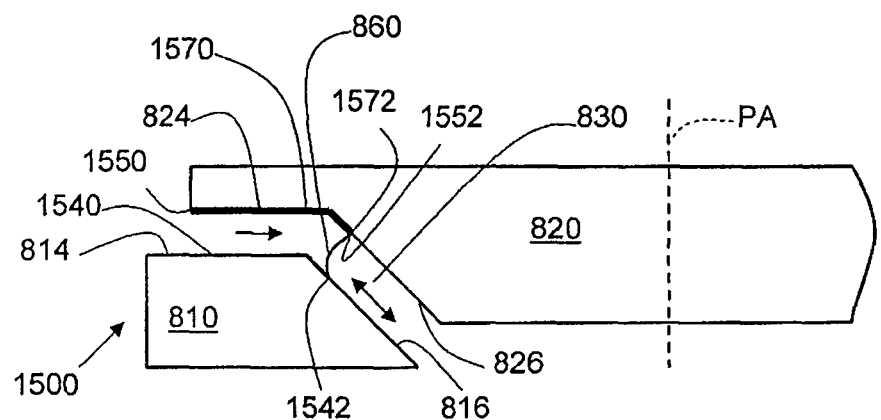
FIG. 15 depicts a cross-section of a liquid confinement system and a portion of the projection system according to an embodiment of the invention.

FIG. 15 illustrates an embodiment of a liquid confinement system 1500, having some of the features of the liquid confinement system 800 of FIG. 8, as indicated by corresponding reference symbols. The liquid confinement system 1500 includes a liquidphobic external layer 1540 that may cover the substantially horizontal surface 814, as well as a portion of the inclined top surface 816 of the barrier member 810. Similar to the embodiments discussed above, this coating 1540 can prevent the immersion liquid from accessing the substantially horizontal top surface 814 of the barrier member 810 during sloshing. One end of the meniscus 860 of the immersion liquid may be pinned to an edge 1542 of the liquidphobic external layer 1540, which is located on the inclined surface 816.

As shown in FIG. 15, the substantially horizontal surface 824 as well as a portion of the inclined surface 826 of the radially outward surface of the portion 820 of the projection system may include a liquidphobic external layer 1550. The liquidphobic external layer 1550 has an edge 1552 which allows an end of the meniscus 860 to be pinned to the edge 1552. In an embodiment, and as illustrated, the liquidphobic external layer 1550 has an edge 1552 that is located opposite the edge 1542 of the liquidphobic external layer 1540 that is provided on the barrier member 810.

The portion 820 of the projection system also includes a UV absorbent layer 1570 that is provided in between the surface of the portion 820 of the projection system itself and the liquidphobic external layer 1550. As illustrated in FIG. 15, the UV absorbent layer 1570 is only provided on substantially all of the radially outward surface of the portion 820 of the projection system that is also covered by the liquidphobic external layer 1550; that is, on the substantially horizontal surface 824 and a portion of the inclined surface 826. An edge 1572 of the UV absorbent layer 1570 is therefore located at the edge 1552 of the liquidphobic external layer 1550. The UV absorbent layer 1570 desirably prevents unwanted radiation from reaching at least the liquidphobic external layer 1550 of the portion 820 of the projection system.

Although many embodiments of the liquidphobic external layers, as well as the UV absorbent layer, have been illustrated and described above, the illustrated embodiments are not intended to be limiting in any way. For example, the liquidphobic outer surfaces of the barrier member and the portion of the projection system may cover more surface area or less surface area than what has been described above and illustrated in the figures. By providing the edges of the liquidphobic outer surfaces of the barrier member and the portion of the projection system at corresponding locations across the gap that is in between the barrier member and the portion of the projection system, the shape of the meniscus may be substantially controlled. By controlling the shape of the meniscus, e.g., minimizing the surface area of the meniscus, evaporation of the liquid in the gap may be minimized. In some embodiments, part of the gap between the barrier member and the portion of the projection system may not be oriented at an incline relative to the projection axis. For example, the gap may be located between substantially horizontal surfaces and/or substantially vertical surfaces of the barrier member and the portion of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more embodiments of the invention may be applied to any immersion lithography apparatus, in particular, but not exclusively, those types mentioned above and whether the immersion liquid is provided in the form of a bath or only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid. A liquid supply system as contemplated herein should be broadly construed.

In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other feature of the liquid. The one or more controlling elements can be provided to control the apparatus. The controller may have a processor which may operate to execute the one or more computer programs.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
a projection system configured to project a patterned radiation beam onto a target portion of a substrate; and
a barrier member, surrounding a space between the projection system and, in use, the substrate, to define in part with a lower surface of a final optical element of the projection system a reservoir for liquid,
wherein a radially outer surface of the barrier member facing a portion of the projection system and a radially outer surface of the portion facing the barrier member each have a liquidphobic outer surface, the liquidphobic outer surface of the barrier member and/or the liquidphobic outer surface of the portion has an inner edge that defines in part the reservoir, the radially outer surface of the barrier member comprising a substantially horizontal surface wherein the liquidphobic outer surface of the barrier member covers at least part of or substantially all of the horizontal surface and wherein, in use, the liquid in the reservoir reaches to at or above the level of the substantially horizontal surface.

2. The lithographic apparatus of claim 1, wherein the liquidphobic outer surface of the barrier member and/or of the portion comprises a coating.

3. The lithographic apparatus of claim 1, wherein the liquidphobic outer surface of the barrier member and/or of the portion comprises a sticker.

4. The lithographic apparatus of claim 1, wherein a gap between the barrier member and the portion of the projection system has a length to width ratio substantially equal to or less than 10:1.

5. The lithographic apparatus of claim 4, wherein the length to width ratio is substantially equal to or less than 5:1.

6. The lithographic apparatus of claim 1, wherein the liquidphobic outer surface of the portion on the projection system comprises an inner edge that defines in part the reservoir.

7. The lithographic apparatus of claim 6, wherein the inner edge is located within a gap defined between the barrier member and the projection system.

8. The lithographic apparatus of claim 1, wherein the radially outer surface of the barrier member comprises an inclined surface, and wherein the liquidphobic outer surface of the barrier member at least partially covers the inclined surface.

9. The lithographic apparatus of claim 1, wherein the radially outer surface of the portion of the projection system comprises a substantially horizontal surface, and wherein the liquidphobic outer surface of the portion of the projection system substantially covers the horizontal surface.

10. The lithographic apparatus of claim 9, wherein the radially outer surface of the portion of the projection system comprises an inclined surface, and wherein the liquidphobic outer surface of the portion of the projection system at least partially covers the inclined surface.

11. The lithographic apparatus of claim 1, wherein the portion of the projection system is the final element of the projection system.

12. The lithographic apparatus of claim 1, wherein the radially outer surface of the barrier member and the radially outer surface of the portion each have a surface extending downwardly from the horizontal surface wherein substantially all of the downwardly surface of the barrier member and/or of the portion is not liquidphobic.

13. A barrier member configured to surround a space between a projection system of a lithographic apparatus and, in use, a substrate, to define in part with a lower surface of a final optical element of the projection system a reservoir for liquid, a portion of the projection system having a radially outer surface having a liquidphobic external layer, wherein a radially outer surface of the barrier member is configured to face the liquidphobic external layer of the portion, and has a liquidphobic external layer, the liquidphobic external layer of the barrier member having an inner edge to define in part the reservoir, the radially outer surface of the barrier member comprising a substantially horizontal surface wherein the liquidphobic outer surface of the barrier member covers at least part of or substantially all of the horizontal surface and wherein, in use, the liquid in the reservoir reaches to at or above the level of the substantially horizontal surface.

14. The barrier member of claim 13, wherein the liquidphobic external layer of the barrier member comprises a coating.

15. The barrier member of claim 13, wherein the liquidphobic external layer of the barrier member comprises a sticker.

16. The barrier member of claim 13, wherein the radially outer surface of the barrier member comprises an inclined surface, and wherein the liquidphobic external layer of the barrier member at least partially covers the inclined surface.

17. The barrier member of claim 13, wherein the radially outer surface of the barrier member has a surface extending downwardly from the horizontal surface wherein substantially all of the downwardly surface of the barrier member is not liquidphobic.

18. A lithographic apparatus, comprising:
a projection system configured to project a patterned radiation beam onto a target portion of a substrate; and
a barrier member, surrounding a space between the projection system and, in use, the substrate, to define in part with a lower surface of a final optical element of the projection system a reservoir for liquid,
wherein a radially outer surface of a portion of the projection system facing the barrier member has a UV absorbent layer with an external surface and a liquidphobic external layer on a portion of the external surface of the UV absorbent layer, and wherein there is a step function in the liquidphobic properties of the radially outer surface of the portion of the projection system, the step function being defined by a boundary between the liquidphobic external layer and the UV absorbent layer due to the liquidphobic external layer covering less than all of the external surface of the UV absorbent layer, the step function defining in part the reservoir for liquid and the step function being located above the lower surface of the final optical element, wherein the liquid in the reservoir can reach to at least the level of the step function.

19. The lithographic apparatus of claim 18, wherein the liquidphobic external layer covers a substantially horizontal surface of the radially outer surface of the portion of the projection system.

20. The lithographic apparatus of claim 18, wherein the liquidphobic external layer covers at least a portion of an inclined surface of the radially outer surface of the portion of the projection system.

21. The lithographic apparatus of claim 18, wherein the UV absorbent layer covers the maximum possible surface of the portion of the projection system, without obscuring the path of the patterned radiation beam.

22. The lithographic apparatus of claim 18, wherein the portion of the projection system is the final element of the projection system.

23. The lithographic apparatus of claim 18, wherein at least a portion of a liquidphobic external layer of a radially outer surface of a portion of the barrier member facing the projection system extends below the level of the step function.

24. A device manufacturing method comprising:
projecting a patterned beam of radiation from a lower surface of a final optical element of a projection system through a liquid onto a target portion of a substrate;
confining the liquid in a space between the lower surface of the final optical element of the projection system and the substrate with a barrier member surrounding the space; and
confining the liquid in a reservoir with
the barrier member surrounding the space,
an inner edge of a liquidphobic radially outer surface of the barrier member facing a portion of the projection system, and
an inner edge of a liquidphobic radially outer surface of the portion of the projection system facing the barrier member,
wherein the radially outer surface of the barrier member comprises a substantially horizontal surface wherein the liquidphobic outer surface of the barrier member covers at least part of or substantially all of the horizontal surface and wherein the liquid in the reservoir reaches to at or above the level of the substantially horizontal surface.

25. The method of claim 24, wherein the radially outer surface of the barrier member and the radially outer surface of the portion each have a surface extending downwardly from the horizontal surface wherein substantially all of the downwardly surface of the barrier member and/or of the portion is not liquidphobic.

26. A device manufacturing method comprising:
projecting a patterned beam of radiation from a lower surface of a final optical element of a projection system, through a liquid in contact with the lower surface, onto a target portion of a substrate;
confining the liquid in a reservoir using a barrier member and an inner edge of a liquidphobic radially outer surface of a portion of the projection system; and
protecting the liquidphobic radially outer surface of the portion of the projection system with a UV absorbent layer in between the portion of the projection system and the liquidphobic radially outer surface, wherein the liquidphobic radially outer surface covers less than all of an external surface of the UV absorbent layer at a location above the lower surface of the final optical element and wherein the liquid in the reservoir can reach to at least the level of the location.

27. The method of claim 26, wherein the portion of the projection system is the final element of the projection system.

28. The method of claim 26, wherein at least a portion of a liquidphobic external layer of a radially outer surface of a portion of the barrier member extends below the level of the location.

* * * * *